(12) United States Patent
Chung et al.

(10) Patent No.: US 11,658,685 B2
(45) Date of Patent: May 23, 2023

(54) MEMORY WITH MULTI-MODE ECC ENGINE

(71) Applicant: MACRONIX INTERNATIONAL CO., LTD., Hsinchu (TW)

(72) Inventors: Chin-Chu Chung, Hsinchu (TW); Chien-Hsin Liu, Hsinchu (TW); Hung-Jen Kao, Hsinchu (TW); Yu-Chih Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/494,361

(22) Filed: Oct. 5, 2021

(65) Prior Publication Data

US 2023/0106125 A1    Apr. 6, 2023

(51) Int. Cl.
*H03M 13/00*   (2006.01)
*H03M 13/35*   (2006.01)
*G06F 11/10*   (2006.01)

(52) U.S. Cl.
CPC ....... *H03M 13/356* (2013.01); *G06F 11/1068* (2013.01)

(58) Field of Classification Search
None
See application file for complete search history.

(56) References Cited

U.S. PATENT DOCUMENTS

| 9,984,768 B2 * | 5/2018 | Hyun | G06F 11/1044 |
| 10,026,483 B1 * | 7/2018 | Shah | G11C 16/08 |
| 10,545,685 B2 | 1/2020 | Tanpairoj et al. | |
| 11,159,176 B1 * | 10/2021 | Venugopal | H03M 13/3961 |
| 11,258,464 B1 * | 2/2022 | Steiner | H03M 13/152 |
| 2011/0307758 A1 * | 12/2011 | Fillingim | G06F 11/1048 714/E11.03 |
| 2013/0031301 A1 * | 1/2013 | Barndt | G06F 3/0679 711/E12.008 |
| 2013/0031438 A1 * | 1/2013 | Hu | G06F 11/1012 714/752 |
| 2015/0012794 A1 * | 1/2015 | Losh | G06F 11/1008 714/755 |
| 2017/0126249 A1 | 5/2017 | Wu et al. | |

(Continued)

FOREIGN PATENT DOCUMENTS

CN      108463807 A     8/2018

OTHER PUBLICATIONS

S. -K. Lu, S. -X. Zhong and M. Hashizume, "Adaptive ECC Techniques for Yield and Reliability Enhancement of Flash Memories," 2016 IEEE 25th Asian Test Symposium (ATS), 2016, pp. 287-292, doi: 10.1109/ATS.2016.64. (Year: 2016).*

(Continued)

*Primary Examiner* — Daniel F. McMahon
(74) *Attorney, Agent, or Firm* — Andrew L. Dunlap; Haynes Beffel & Wolfeld LLP

(57) ABSTRACT

A storage device includes a memory array and a memory controller. The memory controller generates read and write commands for the memory array. An error correction code engine for the storage device is operable to use a plurality of different codeword sizes, different code rates, or different ECC algorithms. Logic is included that applies a selected codeword size, code rate or ECC algorithm in dependence on the operating conditions of the memory array.

21 Claims, 8 Drawing Sheets

(56) References Cited

U.S. PATENT DOCUMENTS

2020/0192791 A1* 6/2020 Yang .................... H04L 1/203
2020/0266830 A1* 8/2020 Kim .................... H03M 13/118
2021/0064467 A1* 3/2021 Buerkle ............. G06F 11/1048

OTHER PUBLICATIONS

T. Mittelholzer, M. Stanisavljevic, N. Papandreou and H. Pozidis, "High-Throughput ECC with Integrated Chipkill Protection for Nonvolatile Memory Arrays," 2021 IEEE International Symposium on Circuits and Systems (ISCAS), 2021, pp. 1-5, doi: 10.1109/ISCAS51556.2021.9401752. (Year: 2021).*

Alsalibi, et al., "A survey of techniques for architecting slc/mlc/tlc hybrid flash memory-based ssds," Concurrency and Computation: Practice and Experience. Jul. 2018, 27 pages.

ATP White Paper, "What is Error detection correction, LDPC, BCH, Reed-Solomon Algorithm?", Memory and Storage Technologies, Jun. 6, 2019, 6 pages, https://www.atpinc.com/blog/ldpc-ssd-low-density-parity-check-ecc-algorithm.

Chen, "What types of ECC should be used on flash memory?", Application Note for SPANSION. Nov. 27, 2007, 5 pages.

Hsieh, et al., "Adaptive ECC Scheme for Hybrid SSD's," IEEE Transactions on Computers, vol. 64, No. 12, Dec. 1, 2015, pp. 3348-3361.

Oh, et al., "Caching less for better performance: Balancing cache size and update cost of flash memory cache in hybrid storage systems," In FAST (vol. 12), Feb. 2012, 14 pages.

SkyHigh Memory White Paper AN99200, "What Types of ECC Should be Used on Flash Memory?", as early as May 2019, 4 pages, http://www.skyhighmemory.com/download/applicationNotes/001-99200_AN99200_What_Types_of_ECC_Should_Be_Used_on_Flash_Memory.pdf.

Wikipedia, "Circular Buffer," downloaded Sep. 17, 2021, 5 pages.

* cited by examiner

MEMORY WITH MULTI-MODE ECC ENGINE

BACKGROUND

Field

The present invention relates to the use of error correction for storage of data in memory that can have different error rates depending on operating conditions of the memory.

Description of Related Art

In data storage systems, error checking and correcting ECC algorithms are often used to improve reliability. ECC algorithms are being used more often in integrated circuit memory devices, such as high-capacity NAND and NOR flash devices, where the error rates can depend on the operating conditions such as temperature, cycle counts, access rates and so on, of the memory.

Also, in many storage systems, it is desirable to optimize power consumption and speed of operation while remaining within specified error rate specifications. In connection with ECC algorithms, the storage systems are configured to store codewords that include a combination of a payload data segment and an ECC code segment computed over the payload data segment. For example, one algorithm can compute a codeword having a 4 kilobit payload data segment plus an ECC code segment computed over the 4 kb. Another algorithm can compute a codeword having a 2 kb payload data segment plus an ECC code segment computed over the 2 kb. Also, different ECC algorithms can have different code rates, where a code rate is the size of the payload data segment divided by the sum of the size of the payload data segment and the size of the ECC code segment in the codeword, which indicates the amount of useable data communicated within a given size codeword. A variety of sizes of codewords and a variety of code rates can be used according to the particular needs of the system.

The sizes of the codewords and the code rates can vary according to specific ECC algorithms applied. Larger ECC codewords for a given payload data segment size can provide better protection strength against errors but require more power consumption and more complex algorithms that can consume larger amounts of processing resources. Smaller codewords on the other hand can save power consumption and rely on simpler algorithms, but may have weaker protection strength for a given code rate.

It is desirable to provide a technology for more efficient use of ECC algorithms in terms of power consumption, speed of operation and complexity, in connection with data storage systems.

SUMMARY

A storage technology is described that provides for adaptive selection of ECC algorithms, with different codeword sizes and/or different code rates, for a memory array in which the error rates can change with operating conditions.

A storage device is described in which error rates can depend on operating conditions. In one aspect, the storage device comprises a memory array, and an error correction code ECC engine in a data path between an input to receive payload data and the memory array. The ECC engine generates codewords for storage in write addresses of the memory array, the codewords including respective payload data segments and ECC code segments. The ECC engine includes logic to implement a particular codeword for storage using a particular write address in the memory array having a selected ECC code rate, and to select the selected ECC code rate from a plurality of ECC code rates as a function of the particular write address and the operating conditions.

In an aspect of the technology, a memory array including a plurality of memory blocks, each memory block in the plurality being disposed on a single integrated circuit chip; and an error correction code ECC engine is disposed in a data path between an input to receive payload data and the memory array, to generate codewords for storage in addresses in an addressed memory block in the plurality of memory blocks, the codewords including respective payload data segments and ECC code segments, the ECC engine including logic to implement the codewords with different ECC code rates, a log mapping the different ECC code rates to addresses, and logic to select the different ECC code rates using the log as a function of the addresses and the operating conditions. In this aspect of the technology, the payload data segment and the ECC code segment of a given codeword are stored together in a same block of the memory array. In some embodiments, the payload data segment and the ECC code segment of a given codeword are stored together on a same page of the same block of the memory array.

In various aspects of the technology, a storage device comprises a memory array and a memory controller operably connected to the memory array. The memory controller generates read and write commands for the memory array. An error checking and correcting ECC engine for the storage device includes logic operable to implement a plurality of different ECC algorithms, which can result in use of different codeword sizes, different code rates, and different correction capabilities. Logic is included that applies a selected codeword size, code rate or ECC algorithm in dependence on the operating conditions of the memory array.

In one approach, the memory controller includes logic to count accesses to portions of the memory array, and the operating conditions include access counts for the portions of the memory array into which the codewords are to be written.

In another approach, a temperature sensor, or other environmental sensor, is included, to which the memory controller has access. The operating conditions in this approach can include the output of the sensor, which may indicate operating temperature of the memory array or of accessed portions of the memory array.

In yet another approach, the memory controller includes wear-leveling logic such as applied in high density flash memory based on monitored endurance data such as program and erase cycle counts in blocks of the memory array, and data access rates to identify hot or cold data. The operating conditions can include wear-leveling status or endurance data.

The memory controller in some embodiments includes logic to map physical addresses of portions of the memory array to the selected codeword sizes, code rates or ECC algorithms selected for the codewords stored in those portions.

In another aspect, the memory array may include portions used for storage of "hot" data and portions used for storage of "cold" data which have high and low access rates, respectively. The operating conditions applied in the selection of the ECC algorithms, codeword sizes or code rates can include whether the address portions are designated for "hot" or "cold" data.

In one technology described herein, the memory array can comprise first and second sub-arrays. In one implementation, the memory array can comprise a high density flash memory on an integrated circuit, with logic to operate the first sub-array on the integrated circuit to store one bit per memory cell, and to operate the second sub-array on the integrated circuit to store more than one bit per memory cell. The memory controller can, for example, apply on procedure to select an ECC algorithm for accesses to the first sub-array, and can apply a different procedure to select ECC algorithms as discussed above, for accesses to the second sub-array.

Also, a memory controller can execute procedures to move a data set from a first sub-array to a second sub-array, and in the execution of the procedure, change the ECC algorithm applied to the data set.

In general, a method for operating a storage device is described, that includes writing a data set to a memory array. The process of writing the data set includes identifying a portion of the memory array in which to store a codeword for the data set, and determining operating conditions of the identified portion. The process can include selecting an ECC algorithm from a plurality of ECC algorithms, which can have different codeword sizes or code rates, in dependence on the determined operating conditions. On selecting the ECC algorithm, one or more codewords is computed using the selected ECC algorithm for the data set. Then, the computed one or more codewords is written to the identified portion or portions of the memory array.

The method can also include reading a particular codeword from an addressed portion of the memory array, mapping the addressed portion of the memory array to the ECC algorithm selected for the addressed portion, and applying the selected ECC algorithm to check for errors in the particular codeword.

A technology is provided using "Self-adaptive ECC". A nonvolatile storage controller can contain a configurable ECC engine that can support a number "n" different types of ECC codewords. The smaller codeword of ECC can save power consumption and gate count. The larger codeword of ECC can provide better protection strength but occupy larger additional space, and involve greater power consumption and a larger gate count.

Other aspects and advantages of the technology can be seen on review of the drawings, the detailed description and the claims, which follow.

DETAILED DESCRIPTION

A detailed description of embodiments of the technology is provided with reference to the FIGS. 1-12.

Figure 1:
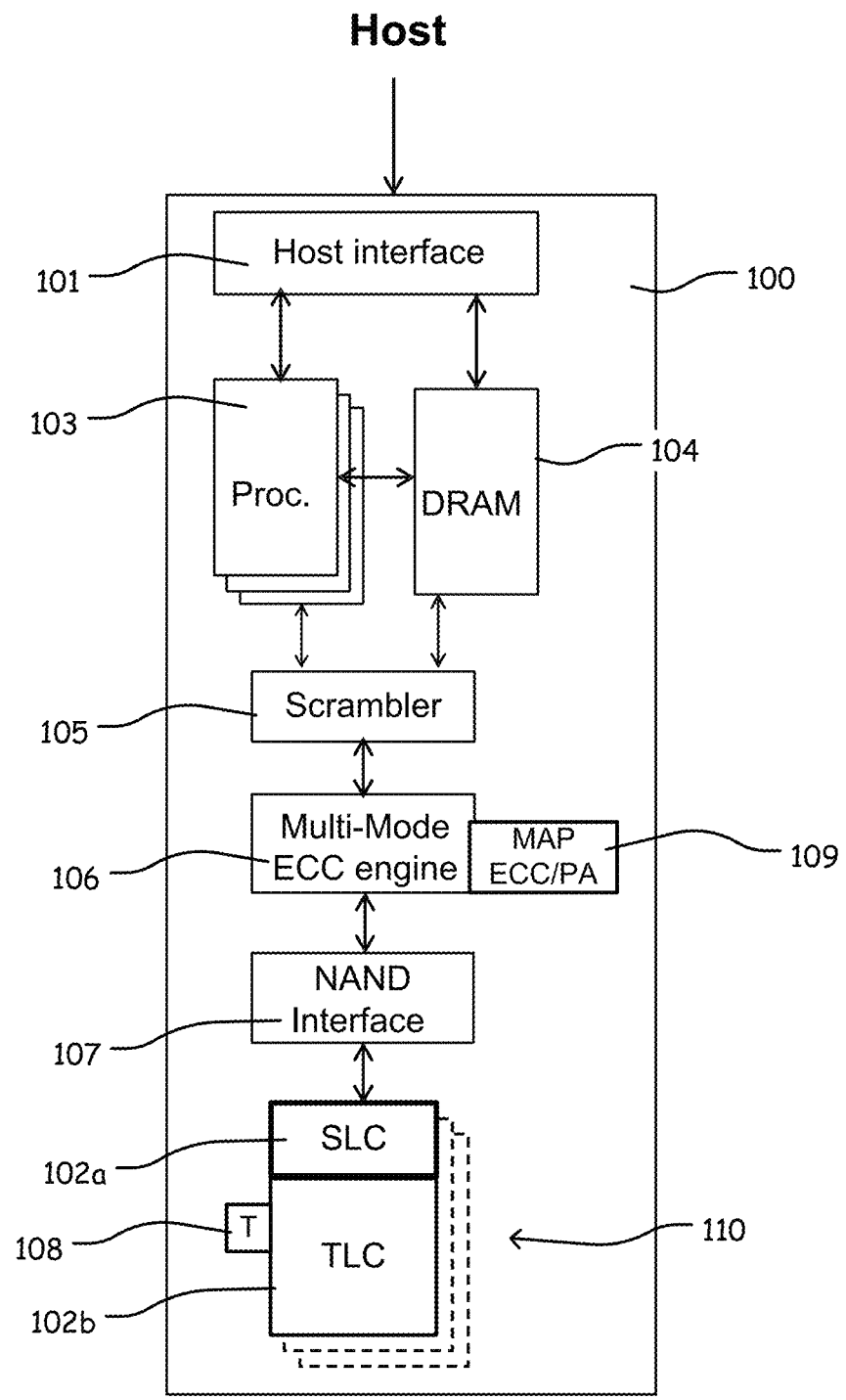
FIG. 1 is a block diagram of a storage device having a memory array and a memory controller, including a multi-mode ECC engine as described herein.

FIG. 1 is a block diagram of one example storage system 100 that includes a memory controller and a memory array. In this example, the storage system can be operated as a solid-state disk. The present technology can be applied in other types of storage systems in which ECC technology is utilized.

The storage system 100 shown in FIG. 1 includes a host interface 101 which connects to a host system that may generate read and write commands for data sets of payload data using logical addresses. Also, the storage system 100 includes a memory array 110 which can comprise one integrated circuit nonvolatile memory device, or as illustrated in FIG. 1, a plurality of integrated circuit nonvolatile memory devices. In the illustrated example, the integrated circuit nonvolatile memory devices can comprise high density flash memory having a NAND array architecture, a NOR array architecture, or other array architectures. Also, the integrated circuit nonvolatile memory devices can include a plurality of sub-arrays. In the illustrated example, a sub-array 102*a* is configured for single level cell SLC operation storing one bit per cell, and a sub-array 102*b* is configured for multiple level cell (triple level cell TLC for example) operation storing more than one bit per cell.

In this example, a memory controller is connected between the host interface 101 and the memory array 110. The memory controller can include one or more processors 103 to execute memory procedures, such as wear leveling, logical-to-physical address translation, arbitration for access to the memory array 110, maintain read access counts for hot and cold data classification, maintain program and erase counts for portions of the memory array, and so on. The memory controller can include a buffer 104 implemented, for example, using DRAM or SRAM, which is accessible by the one or more processors 103. The memory controller in some embodiments includes a scrambler 105 in data flow communication with the one or more processors 103 and with the buffer 104. The memory controller shown in FIG. 1 includes a multi-mode ECC engine 106 which includes logic to implement a plurality of ECC algorithms having different codeword sizes and different code rates as suits a particular embodiment. The multi-mode ECC engine 106 can include state machines implemented using dedicated logic circuits, configurable logic circuits, general purpose processors executing software, or otherwise. In some embodiments, the multi-mode ECC engine 106 can be implemented using computer programs executed by the one or more processors 103. The memory controller can implement protocols such as a flash translation layer FTL to translate host read and write commands for payload data, to commands usable by the flash memory integrated circuits for reading and writing ECC codewords.

In the configuration of FIG. 1, the multi-mode ECC engine 106 is in data flow communication with a NAND interface block 107 (for the case in which the memory array 110 is implemented using NAND architecture integrated circuits). The interface block 107 can include circuits to execute the input/output protocols for the integrated circuit memory devices in the memory array 110, including logic to provide commands and physical addresses used for read, program and erase operations in the memory array 110. A "write" operation for a nonvolatile memory can be a "program" operation, or a combination of program and erase operations.

The memory controller can also maintain a log, such as a table 109 in memory, or other types of logic circuits or programs, mapping physical addresses, such as block addresses, at which the codewords are written to the selected ECC algorithms applied to generate the codewords.

The memory array 110 can be characterized by error rates in different portions of the memory array 110 that vary in different operating conditions. The operating conditions can be reflected in operating temperatures, wear leveling parameters provided by wear leveling procedures, program/erase counts and access frequencies (including reads) which can be maintained in the memory controller, detected error rates (endurance data) which can be periodically tested using read and copy back procedures for blocks of memory cells in the array 110, certain memory operations, such as movement of a data set from one sub-array (e.g. a SLC sub-array) to a different sub-array (e.g. a TLC sub-array), or other conditions that may be represented by signals applied, or data provided, to the memory controller. In FIG. 1, the storage system 100 includes a temperature sensor 108 (or other type of environmental sensor) which provides data to the memory controller which can indicate the temperature or other environmental condition of operation of the memory array 110 or portions of the memory array 110, and used by logic in the memory controller to select an ECC algorithm, code rate or codeword size.

There are many classes of ECC algorithms suited for use in the present technology. Examples of classes of ECC algorithms include Low-Density Parity Check (LDPC) algorithms (also known as Gallagher algorithms), Hamming algorithms, Reed-Solomon algorithms, and Bose-Chaudhuri-Hocquenghem (BCH) algorithms. A single class of algorithms can be adjusted to achieve different error detection and correction capabilities, different code rates and different codeword sizes by changing parameters used to compute the codewords. So, for the purposes of the present description, one class of algorithms can be used to implement the logic for a plurality of ECC algorithms by using different parameters for the ECC algorithms in the memory controller (e.g., in the multi-mode ECC engine 106). Also, more than one class of algorithms can be used to implement the logic for a plurality of ECC algorithms in the memory controller.

A memory controller, an example of which is described with reference to FIG. 1, includes logic to execute a procedure for operating the memory that includes reading and writing codewords in the memory array, where the codewords in combination form a data set used in a host processor. A procedure executed in this context can include writing a data set to a memory array, including identifying a portion of the memory array, and determining operating conditions of the identified portion, selecting an ECC algorithm from a plurality of ECC algorithms having different codeword sizes or code rates in dependence on the determined operating conditions and the identified portion of the array, computing one or more codewords using the selected ECC algorithm for the data set, and writing the computed one or more codewords to the identified portion of the memory array. Also, a procedure executing in this context can include reading a particular codeword from an addressed portion of the memory array, mapping the addressed portion of the memory array to the ECC algorithm selected for the addressed portion, and applying the selected ECC algorithm to check for errors in the particular codeword. The logic to execute the procedures can be implemented as described with reference to FIG. 1, or in other configurations. For example, the memory controller and the memory array can be parts of a single integrated circuit.

Figure 2:
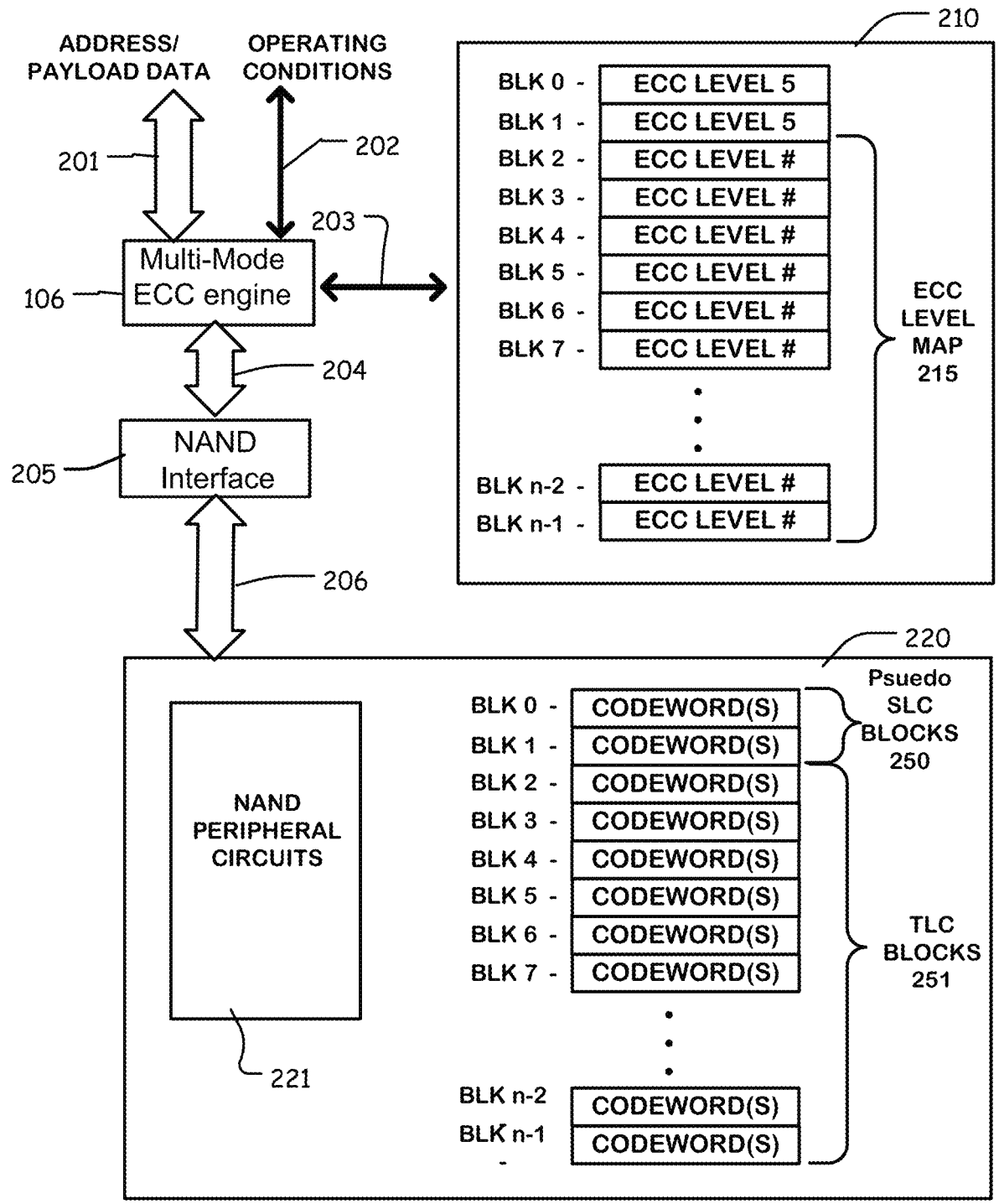
FIG. 2 is a diagram illustrating an ECC code rate log and memory organization for a storage device like that of FIG. 1.

FIG. 2 illustrates part of a storage system having an ECC code rate log and memory organization for an embodiment of the technology. In this example, a source of payload data provides input on bus 201 to a multi-mode ECC engine 106. Also, operating conditions are signaled on line 202 from a source of operating condition signals as discussed above, as input to the multi-mode ECC engine 106. The multi-mode ECC engine 106 generates codewords for storage in a memory array 220 using an ECC code rate selected from the log 210. The multi-mode ECC engine 106 is configured for data flow communication across bus 204 with a NAND interface 205, which can manage access to one or more integrated circuit memory devices. In the illustrated embodiment, the NAND interface 205 is configured for data communication with an integrated circuit including memory array 220 across bus 206.

In this example, the memory array 220 is a NAND flash memory disposed on a single integrated circuit having peripheral circuits 221 which include command decoders, address decoders and other circuits necessary for performing memory operations in the memory array 220. Also, in this example, the memory is organized into a plurality of blocks on the single integrated circuit, labeled by block addresses BLK 0, BLK 1, BLK 2, . . . BLK n−1. The plurality of blocks can be organized into a plurality of pseudo-single level cell SLC blocks 250 which for the purposes of this example include blocks having addresses BLK 0 and BLK 1, and a plurality of triple level cell TLC blocks 251 which for the purposes of this example include blocks having addresses BLK2 to BLK n−1. The plurality of blocks can comprise memory cells implemented using the same technology, and operated as single level cells in some blocks and multiple level cells (such as triple level cells) in other blocks. In other examples, the plurality of blocks can include different types or variations of memory cells in the different types of blocks.

A memory block as described herein is a portion of physical memory which can be identified by a block address. A block address is a portion of an address used to access data in the memory array. For example, a memory address may include 38 bits to identify storage locations for individual bytes stored in the memory array. Of the 38 bits, a number of higher order bits, such as two higher order bits, can identify a memory plane on the integrated circuit chip, a number of first intermediate order bits, such as 16 intermediate order bits, can identify individual blocks within the memory planes, and a number of second intermediate order bits, such as 12 intermediate order bits, can identify individual pages within the individual blocks, and a number of lower order bits, such as 8 lower order bits can identify individual bytes within the individual pages. In some embodiments, individual pages within a block can include extended (or spare) areas normally used to hold metadata associated with data in the individual pages. A block address includes the address bits in the memory address sufficient to uniquely identify a block. The logical and physical arrangements of blocks depend on a number of factors, including the particular type of memory, program and erase algorithms, manufacturing techniques applied and so on, and therefore can vary from one type of memory array to another.

As illustrated in FIG. 2, the multi-mode ECC engine 106 is coupled by line 203 to a log 210 that comprises a store, like a register file, SRAM, DRAM, PCRAM, or flash memory, holding a map of block addresses to ECC code rates, where an ECC code rate is indicated by the parameter ECC LEVEL # in this illustration. Different blocks can have different ECC code rates. As mentioned above, the multi-mode ECC engine 106 can have resources to execute a plurality of different ECC algorithms and implement a plurality of different code rates. Each ECC level can indicate the selected one of the algorithms used to implement selected code rates. As seen in the illustration, each of the blocks having block addresses BLK 0, BLK 1, BLK 2, . . . BLK n−1, in the memory array 220 has a corresponding entry in the log 210. Also in this example, as indicated by the ECC level map 215, SLC blocks BLK0 and BLK1 can have an ECC level determined for the corresponding memory level, which can be fixed as indicated in this figure arbitrarily as ECC LEVEL 5, or dynamically determined using a different procedure than that applied for the other blocks (see e.g., FIGS. 11-12 below).

Figure 3:
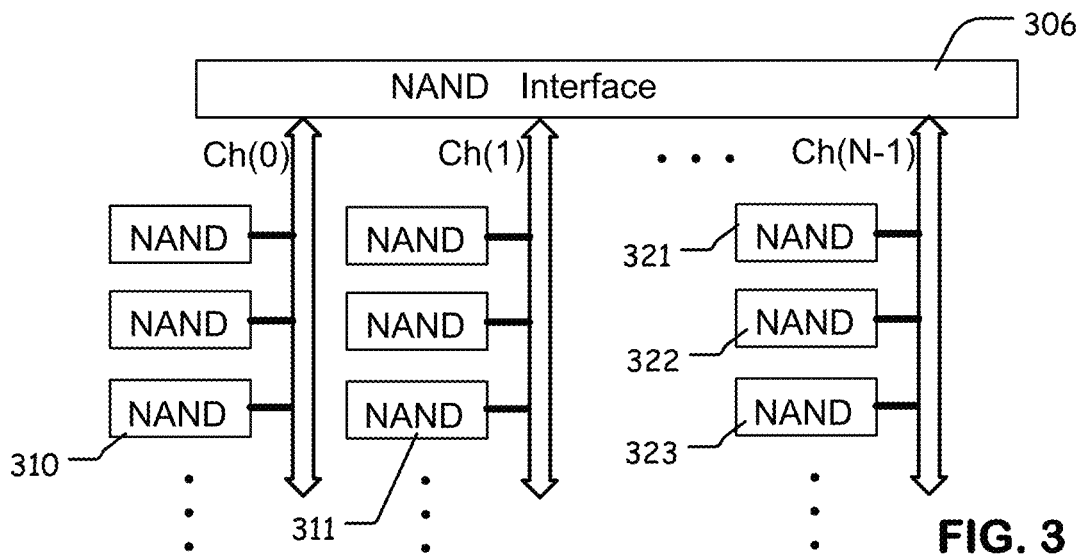
FIG. 3 illustrates one example of a memory array including a plurality of NAND memory chips arranged in a plurality of channels for a system like that of FIG. 1.

FIG. 3 illustrates a configuration of a system like that of FIG. 1 in which the memory array includes a plurality of NAND flash memory chips coupled to the NAND interface 306, like the interface in block 107 of FIG. 1. In this configuration, the NAND interface 306 provides for communication with a plurality of data channels Ch(0), Ch(1), . . . Ch(N−1). Each data channel is coupled to a plurality of NAND flash chips. Thus, as illustrated channel Ch(N−1) is coupled to a set of NAND flash chips 321, 322, 323 . . . Channel Ch(0) is coupled to a set of NAND flash chips including NAND flash chip 310. Channel Ch(1) is coupled to a set of NAND flash chips including NAND flash chip 311. Each of the NAND flash chips in the system of FIG. 3 can include one or more blocks. For a NAND flash chip having a terabit storage capacity, for the purposes of an example the chip can include 4 planes, each plane having 1438 blocks, each block having 1536 pages, and each page having 16,384 main area bytes and 2048 spare area bytes.

Figure 4:
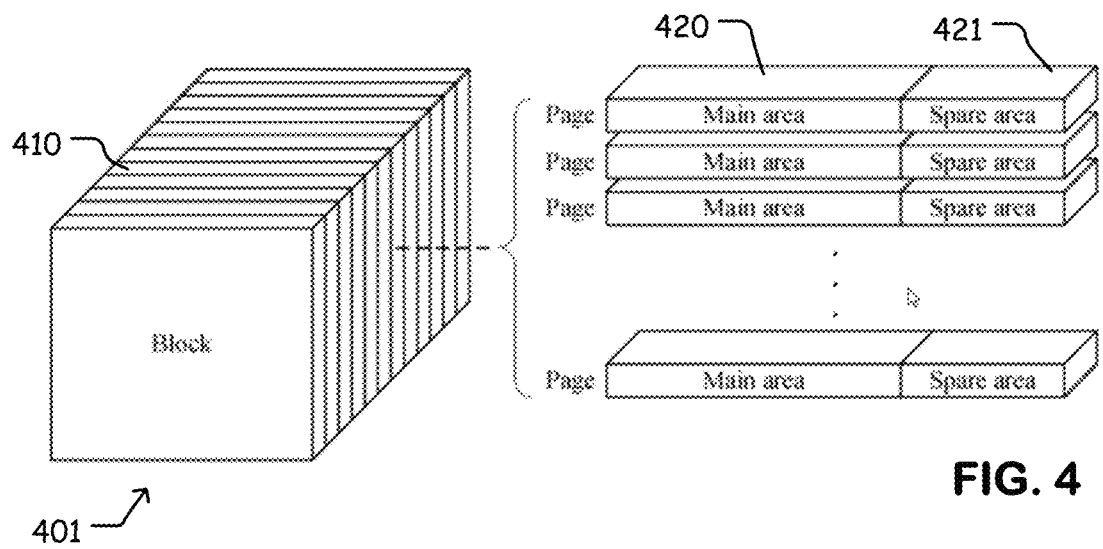
FIG. 4 illustrates an example of a memory organization comprising blocks in pages suitable for use in storage devices as described herein.

FIG. 4 illustrates an organization of a 3D NAND flash array on a single integrated circuit, which supports the multi-mode ECC operation as described herein. In this example, a plane 401 includes a plurality of blocks (e.g. 410). Each block includes a plurality of pages where each page includes a main area 420 and a spare area 421, typically used for holding metadata. When writing codewords as described herein, both the payload data segment and the ECC code segment of the code words can be written in the same physical block, and in some embodiments in the same physical page. In embodiments writing the ECC code words on a physical page, the payload data segment and the ECC code segment can be written contiguously within the main area. In other embodiments writing the ECC code words on a physical page, the payload data segment can be written within the main area of the page, and the ECC code segment can be written in the spare area of the page. In advantageous embodiments, codewords having different code rates are stored so that they can be retrieved in a single read operation in a single chip, such as a single page read operation, or in a sequential read operation using sequential addresses from sequential pages of the memory array. In illustrated examples, the ECC level or code rate is set on a block address basis. In other embodiments, the ECC level or code rate can be set on a combination of block address and page address basis for some or all the blocks in the memory array.

Figure 5:
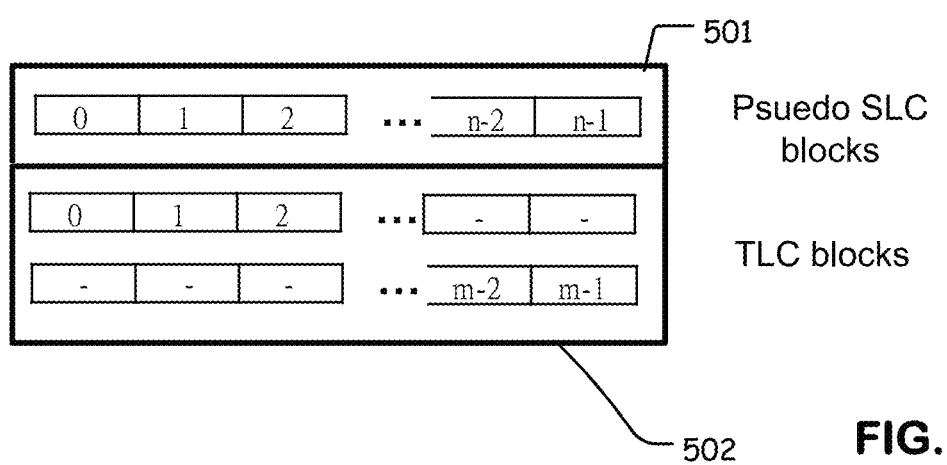
FIG. 5 is a simplified block diagram of a memory array including first and second sub-arrays according to an aspect of the technology.

FIG. 5 is an illustration of a memory array comprising a first sub-array 501 and a second sub-array 502. In this example, the first sub-array comprises a plurality of single level cell SLC blocks and the second sub-array comprises a plurality of triple level cell TLC blocks in a configuration that is deployed in high density NAND flash integrated circuit devices, and can be deployed in other types of memory devices. In some embodiments, the SLC blocks and the TLC blocks can be implemented on the same integrated circuit. In some embodiments, the SLC blocks and the TLC blocks are statically configured and can have different memory cell structures or different read/program/erase algorithms to accommodate the single-bit-per-cell or multiple-bit-per-cell operation. In other embodiments, an array of memory cells suitable for multiple level cell operation is provided, and blocks in the first sub-array can be dynamically selected for SLC operation, sometimes referred to as pseudo-SLC blocks. SLC blocks can have faster access time, and greater operating margins than multi-level cell blocks. Therefore, SLC blocks may operate with higher ECC code rates (more data per codeword) and smaller codewords for a given amount of data, than TLC blocks, in some examples. Thus, in embodiments having this feature, an operating condition for selecting an ECC algorithm can be whether the physical address points to an SLC block or a TLC block.

Figure 6:
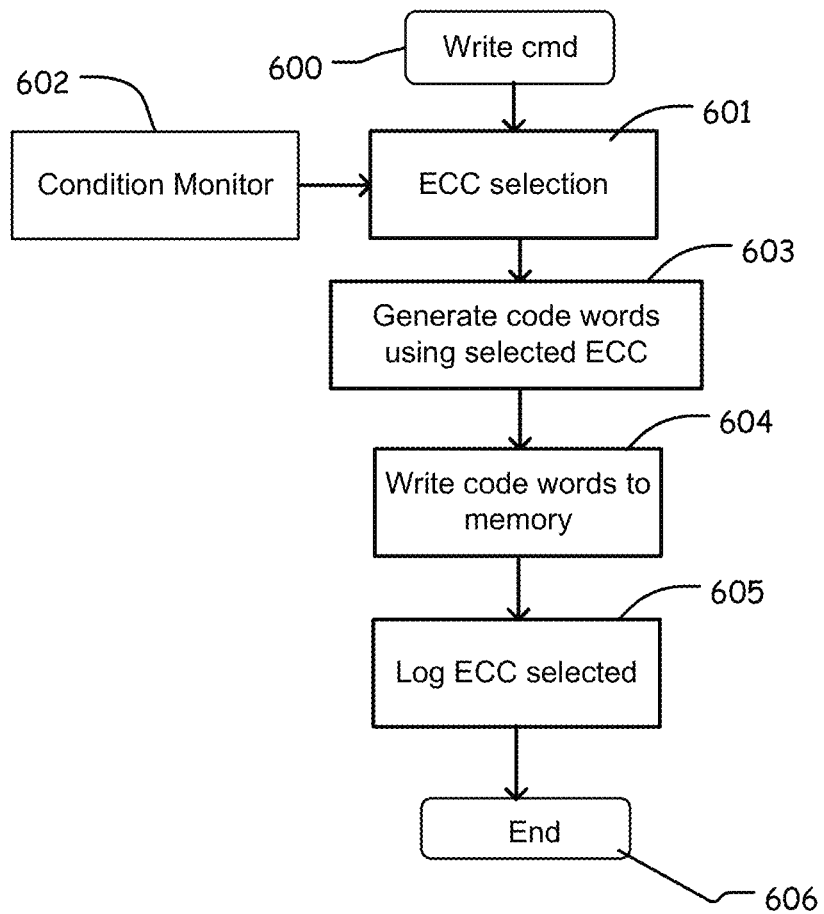
FIG. 6 is a flowchart illustrating operation of logic in one aspect of the memory controller for selecting ECC algorithms in a write procedure.

FIG. 6 is a simplified flowchart of a procedure implemented in the memory controller like that of FIG. 1. In FIG. 6, a write command is received at the memory controller (block 600). The memory controller receives input from an operating condition monitor 602 and selects an ECC level with an algorithm to be applied using the multi-mode ECC engine to implement a selected code rate (block 601). The ECC level selected can also be a function of the physical address to which the data is to be written in the memory array.

After selection of the ECC level block 601, the multi-mode ECC engine generates codewords to be written to the memory array using the selected ECC algorithm (block 603). Next, the codewords are written to the memory array (block 604). Also, the selected ECC code rate is logged in a table mapping physical addresses to which the codewords are written to the selected ECC levels applied to generate the codewords (block 605). Then, the flow chart of FIG. 2 is completed (block 606).

Figure 7:
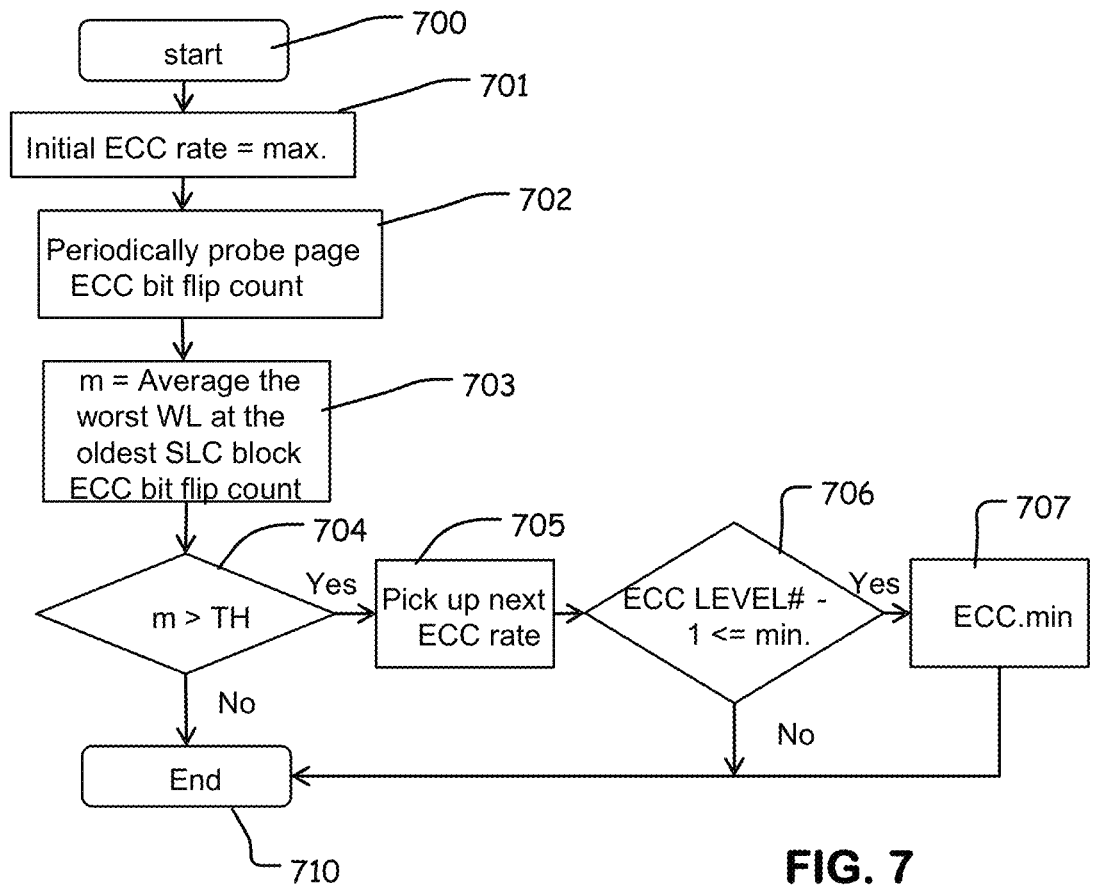
FIG. 7 is a flowchart illustrating an operation for selecting an ECC algorithm according to one aspect of the technology.

FIG. 7 is a flowchart of a procedure executed by the memory controller for selecting an ECC level in response to operating conditions. In this example, the plurality of ECC levels is characterized by having different ECC code rates, where for an ECC codeword having an "n" bit segment of native payload data and a "k" bit segment of redundant, ECC code data, the ECC code rate is equal to n/n+k.

In the procedure of FIG. 7, the process starts at block 700. An initial ECC code rate is set to a maximum code rate (block 701), which typically correlates with a lower error correction capability and higher throughput. The procedure periodically, or from time to time as suits a particular limitation, probes pages in the memory array to detect counts of bits that are corrected (bit flips) by the ECC operation (block 702), or other operating conditions. These probes can be executed using a read and copy back operation. The bit flip information can be accumulated to form a statistical measure "m" (block 703). For example, in a memory array including a sub-array having a plurality of blocks, the statistical measure can be an average of the bit flip counts on word lines of a set of blocks in the sub-array having been least recently accessed. In other embodiments, the statistical measure can be simply the bit flip count on a single word line, which can be considered to reflect an operating condition of the array, or portion of the array, in general.

Next, the statistical measure m is compared with the threshold (block 704). If the measure m is greater than a threshold, then the ECC algorithm branches to a procedure to select a next code rate (block 705). Next, it is determined whether the ECC code rate parameter (e.g. ECC LEVEL #) as decremented is less than or equal to the minimum value, corresponding to the lowest ECC code rate available for the particular portion of the memory array (block 706). In one approach, the ECC code rate can be decremented by one, and if the decremented ECC code rate parameter is not set at the minimum, the ECC algorithm is changed to the algorithm supporting the next code rate (block 707) and the algorithm ends (block 710). If the ECC code rate parameter at step 706 is less than or equal to the minimum, then the ECC algorithm having the minimum code rate is set or maintained (block 707), and the flow chart ends (block 710).

Figure 8:
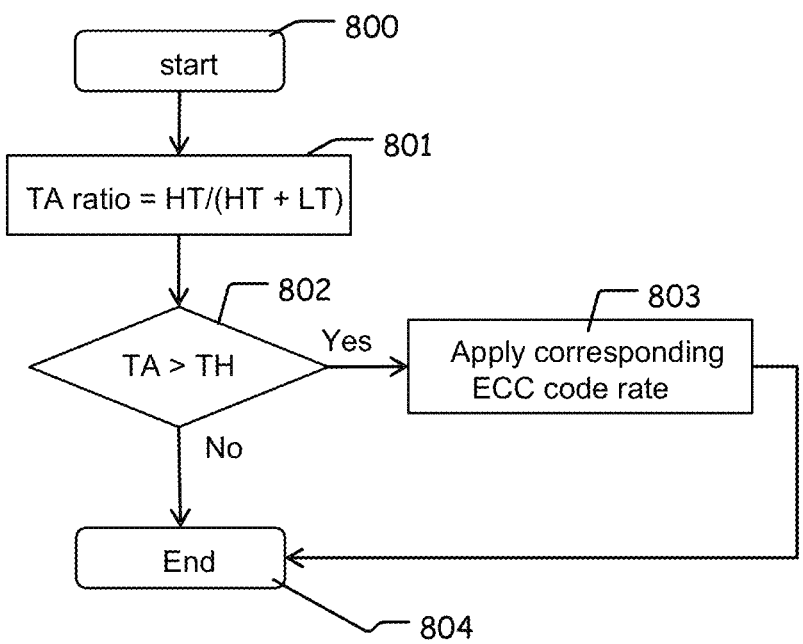
FIG. 8 is a flowchart illustrating operation for selecting an ECC algorithm according to another aspect of the technology.

FIG. 8 is a flowchart of another procedure executed by the memory controller for selecting an ECC algorithm in response to operating conditions of the memory array, where in this example, the operating conditions are indicated by an environmental sensor such as a temperature sensor. This algorithm begins at block 800. In this procedure, the output of the temperature sensor is used to compute a statistical parameter "TA ratio", which is equal to HT/(HT+LT), where HT is a high temperature sensed during an interval, and LT is a low temperature sensed during the interval (block 801). In this way, a higher TA ratio indicates large temperature fluctuations during the interval, and a lower TA ratio indicates smaller temperature fluctuations during the interval. Then, the TA ratio is periodically checked against a threshold (block 802). If the threshold is exceeded, then a new ECC level having a changed code rate can be selected (block 803), and the flow chart ends (block 804). If the TA ratio does not exceed the threshold, then the ECC level can remain the same, and the flow chart ends (804).

Other algorithms and other statistical parameters of FIG. 8, corresponding to temperature, can be utilized including, for example, a raw temperature measure of the integrated circuit memory device being used, or of an environment in which the storage system is deployed.

Figure 9:
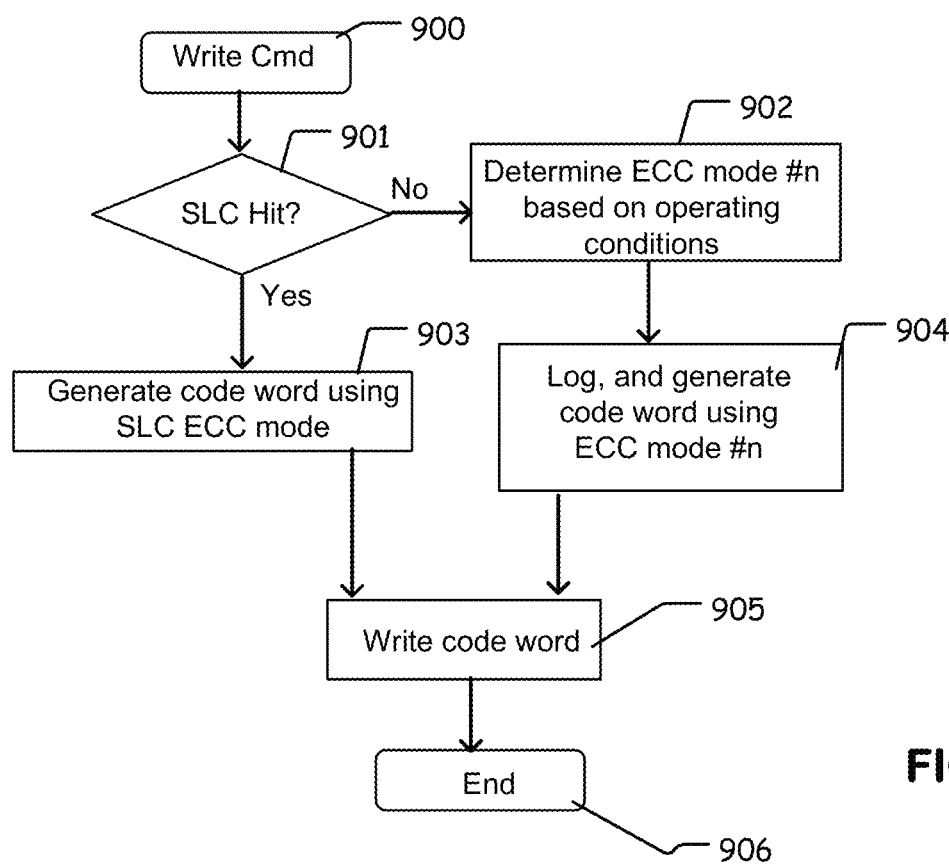
FIG. 9 is a flowchart illustrating an operation for generating codewords in the memory array including first and second sub-arrays according to one aspect of the technology.

FIG. 9 is a flowchart of a write procedure which can be executed by the memory controller for a memory array having an SLC sub-array and a TLC sub-array (or multilevel cell sub-array). The procedure of FIG. 9 begins at block 900 with receiving a write command. The command is processed to determine the physical location in which the data is to be written, including whether the target is an SLC block (901). If the target physical address is in an SLC block, a codeword is generated using the SLC ECC level (e.g. ECC LEVEL 5 as used in FIG. 2) set up for the operation (block 903). If at block 901, the target physical address is not in an SLC block, then the ECC mode can be determined based on operating conditions (block 902), the selected ECC mode is logged in a table mapping ECC level to physical address, and an ECC codeword is generated using the selected level (block 904). After generation of a codeword at block 903 or block 904, the codeword is written to a physical address in the SLC or TLC block as appropriate (block 905) and the flow chart ends (block 906).

A memory array having multiple sub-arrays, such as an SLC sub-array and a TLC (or multiple level cell) sub-array, can be operated in a manner that treats the SLC sub-array as a cache memory, to take advantage of the differences in access times. Data is moved between the SLC sub-array and the TLC sub-array as part of the cache management operations which can be implemented in the storage system of FIG. 1 using computer programs executed by the processors. A write procedure used to move the data between the SLC sub-array and the TLC sub-array, or between the TLC sub-array and the SLC sub-array, can be executed as shown in FIG. 10, in a way that results in a change in the ECC level when the data is moved between the sub-arrays.

Figure 10:
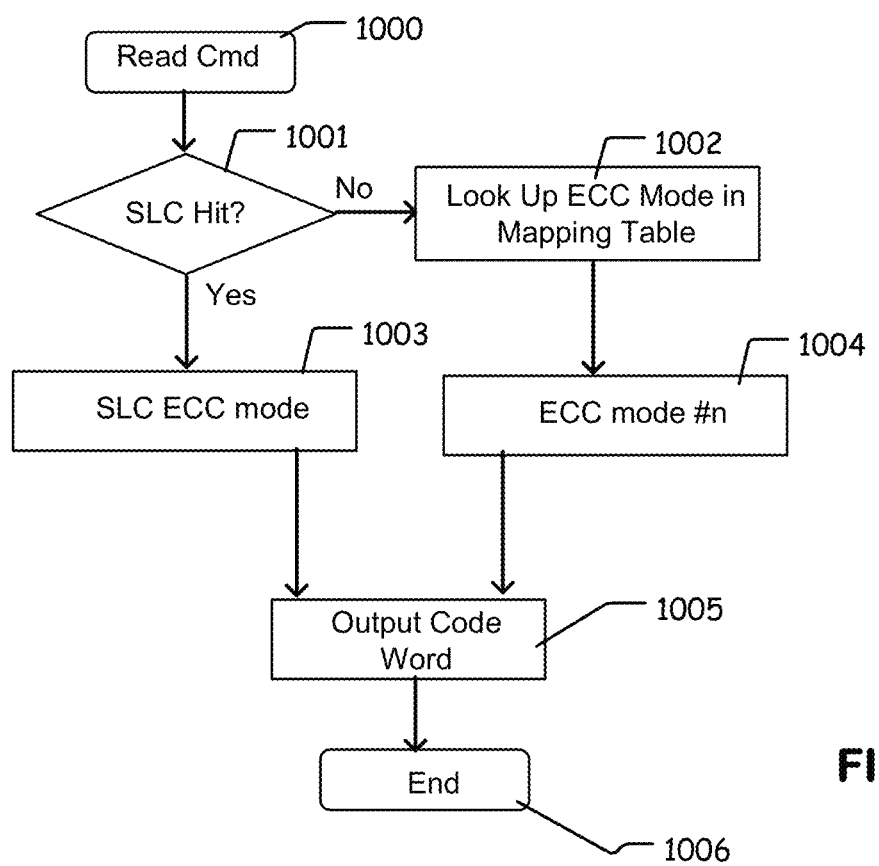
FIG. 10 is a flow chart for reading data from a memory array including first and second sub-arrays having codewords generated as shown in FIG. 9.

FIG. 10 is a flowchart of a read procedure which can be executed by the memory controller for a memory array having an SLC sub-array and a TLC sub-array. The procedure of FIG. 10 begins with receiving a read command (block 1000). The command is processed to determine the physical block address, and whether the target is an SLC block (1001). If, at block 1001, the target physical address is an SLC block, then the SLC ECC level is established (block 1003), and the codeword is output from the array (block 1005) for ECC processing. If at block 1001, the target physical address is a TLC block, then the ECC level is determined from the log that maps the ECC mode to a physical block address (block 1002). Then, the ECC mode indicated by the log is established (block 1004), and the codeword is output from the memory array for ECC processing (block 1005). After the codeword is output, the procedure shown in FIG. 10 is completed (block 1006).

Figure 11:
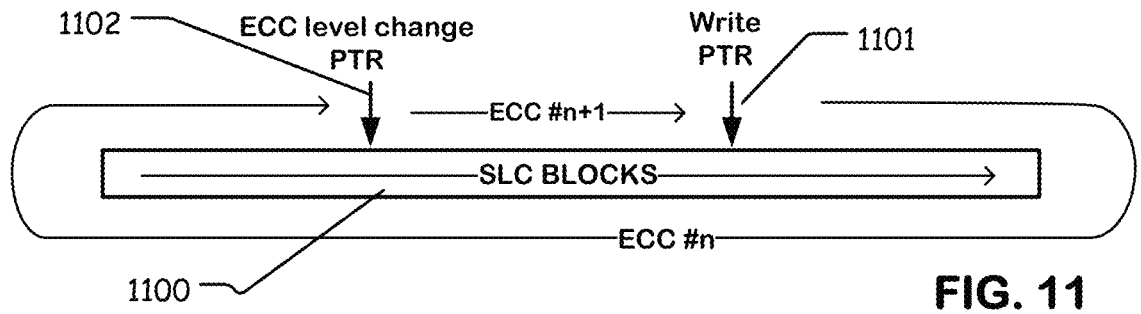
FIG. 11 illustrates an SLC area operated in a circular buffer mode.

In some embodiments, a memory device including an SLC area and a MLC area can be operated in a manner that treats the SLC area as a circular buffer. The circular buffer management routine can be executed in flash translation layer logic at the memory controller (e.g., processors 103 of FIG. 1) or in other control nodes in the system. FIG. 11 is a simplified illustration in which the SLC blocks 1100 are accessed in response to a write pointer 1101. Each new codeword is written to the physical block address identified by the write pointer 1101, and the write pointer is incremented. As the write pointer increments to the end of the array, it wraps around to the beginning, proceeding in a circular buffer arrangement. A garbage collection routine or other routine can be executed to maintain the next block after the write pointer in a ready state to receive a new codeword. For example, an SLC block holding valid data in a region after the write pointer can be copied to a MLC block, and the SLC block can be erased thus freeing the SLC block for write of a new codeword. In this manner, the write pointer 1101 should not overflow to cause overwriting of valid data.

For dynamic control of the ECC level in a SLC area operated as a circular buffer, the system can also maintain an ECC level change pointer 1102. The dynamic selection of the ECC level can be executed for each write into the SLC area by determining the operating conditions of blocks in the SLC at the time of the write. If it is determined that the ECC level should change based on the current operating conditions, then the ECC level change pointer 1102 is moved to the location of the current write pointer 1101, and the new ECC level is applied to all blocks going forward until the ECC mode is updated in response to a change in conditions.

For a read operation, the SLC block for the read is compared to the ECC level change pointer 1102. For a read in an area of the SLC located clockwise (to the right) between the ECC level change pointer 1102 at which the ECC level was changed to ECC level n+1, the ECC level #n+1 is applied to check the codeword for errors. For a read in an area of the SLC located counterclockwise (to the left) in the circular buffer addressing between the ECC level change pointer 1102 and the current write pointer 1101, the previous ECC level #n is applied to check the codeword for errors.

In this example, there are only two regions of the SLC circular buffer defined for the purposes of applying different ECC levels. These regions can be delineated by the ECC level change pointer 1102 as discussed above. Eventually, the SLC blocks written using the earlier ECC level #n will be freed by a garbage collection or otherwise in the new ECC level #n+1 applied. A first ECC region includes the block at the ECC level change pointer, and blocks in the clockwise direction until the newest valid SLC block, all of which will have been written after the change. A second ECC region includes the block preceding the ECC level change pointer and blocks in the counterclockwise direction until the oldest valid block. In some embodiments, there may be more than one ECC level change pointer maintained, dividing the SLC circular buffer into more than two regions.

Figure 12:
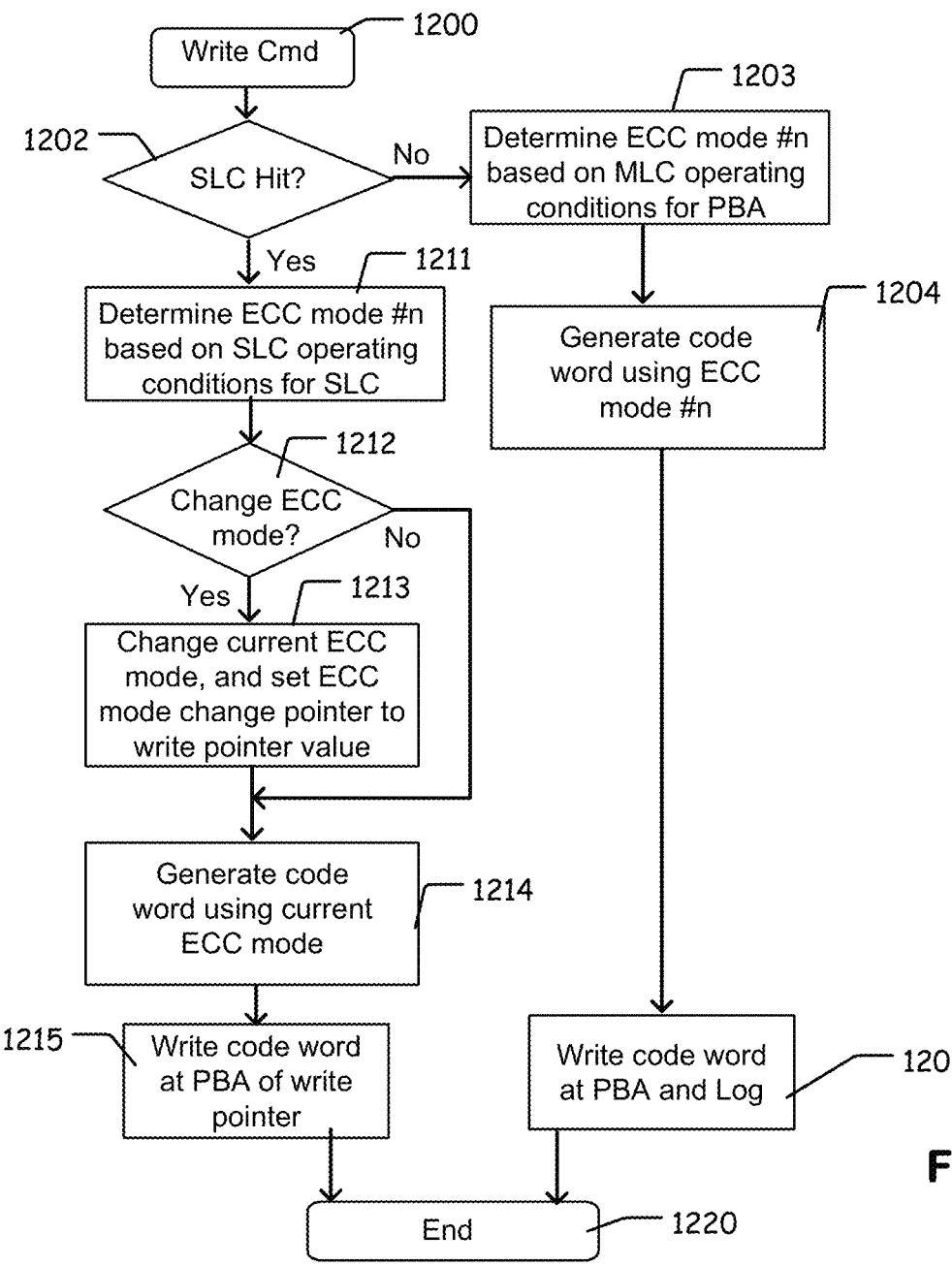
FIG. 12 is a flow chart for writing data in an SLC area like that of FIG. 11.

FIG. 12 is a flowchart of a write operation to a memory including a SLC circular buffer such as described with reference to FIG. 11. In FIG. 12, a write command is received (1200). It is determined whether the write command is a hit in the SLC area of the memory (1202). If not, then the ECC mode is determined based on the MLC operating conditions for the physical block address of the write (1203). Using the determined ECC mode, a codeword is generated (1204). Then the codeword is written at the physical block address, and the ECC mode for that physical block is written in the log (1205). At this point, the write operation ends (1220).

If at block 1202, it is determined that it is a hit in the SLC circular buffer area, then the ECC mode number is determined based on the operating conditions for the SLC in general, or for a selected block in the SLC (1211). Next is determined whether the current ECC mode number is changed based on the operating conditions (1212). If it is changed, the current ECC mode is changed, and the ECC mode change pointer is moved to the location of the write pointer (1213). If the ECC mode is not changed at block 1212, or after changing the ECC mode block 1213, the ECC codeword is generated using the current ECC mode (1214). Then, codeword is written to the physical block address of the write pointer in the SLC area (1215). Finally, the algorithm is ended (1220). This is an example of logic to operate a first sub-array (e.g. the SLC area) as a circular buffer, and to change an ECC code rate base on a first change in operating conditions when a current write operation is executed and to apply the changed ECC code rate to subsequent writes in the first sub-array until a second change in operating conditions is determined. This is an example of a method to operate the first sub-array as a circular buffer and maintaining a write pointer and an ECC level change pointer; changing an ECC code rate base on a change in operating conditions when a write operation is executed and updating the ECC level change pointer to the write pointer; and applying a selected ECC code rate based a position of a read address relative to the ECC level change pointer.

A number of flowcharts illustrating logic executed by a memory controller or by a memory device are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A storage device in which error rates can depend on operating conditions, comprising:
    a memory array including a plurality of memory blocks, each memory block in the plurality being disposed on a single integrated circuit chip; and
    an error correction code (ECC) engine in a data path between an input to receive payload data and the memory array, to generate codewords for storage in addresses in an addressed memory block in the plurality of memory blocks, the codewords including respective payload data segments and ECC code segments, the ECC engine including (i) logic to implement the codewords with different ECC code rates, (ii) a log mapping the different ECC code rates to addresses of the plurality of memory blocks, and (iii) logic to select the different ECC code rates, according to which the codewords are implemented, using (a) the log to identify the different ECC code rates according to the addresses of the plurality of memory blocks and (b) the operating conditions, such that the different ECC code rates are selected in dependence on both the addresses mapped to the different ECC code rates and the operating conditions.

2. The device of claim 1, wherein the ECC engine includes logic to process codewords having been read, with different ECC code rates, from read addresses in the memory array, and logic to determine, from the log, the ECC code rates for the codewords having been read.

3. The device of claim 1, including logic to count accesses to portions of the memory array, and the operating conditions include access counts.

4. The device of claim 1, including a temperature sensor, and the operating conditions include outputs from the temperature sensor.

5. The device of claim 1, including wear-leveling logic which maintains data about endurance of portions of the memory array, and the operating conditions include endurance data.

6. The device of claim 1, including program/erase cycle logic which maintains data about program/erase cycle counts of portions of the memory array, and the operating conditions include program/erase cycle counts.

7. The device of claim 1, wherein the addresses include physical block addresses of blocks in the plurality of blocks, and the log maps the physical block addresses to the ECC code rates.

8. The device of claim 1, wherein the blocks in the plurality of blocks each include a plurality of pages, and wherein the codewords are stored in respective pages.

9. The device of claim 1, wherein the memory array includes first and second sub-arrays, including logic to apply a set ECC code rate to addresses in the first sub-array.

10. The device of claim 9, wherein the first and second sub-arrays are on a single integrated circuit, and including logic to operate the first sub-array to store one bit per cell, and to operate the second sub-array to store multiple bits per cell.

11. A controller for use between a nonvolatile memory array and a source of payload data, to generate read and write commands for the nonvolatile memory array using physical addresses, comprising:
    an error correction code (ECC) engine in a data path between an input to receive payload data and the memory array, and configured to generate codewords for storage in addresses in an addressed memory block in the nonvolatile memory array, the codewords including respective payload data segments and ECC code segments,
    wherein the ECC engine further includes (i) logic to implement the codewords with different ECC code rates, (ii) a log mapping the different ECC code rates to addresses of the addressed memory block, and (iii) logic to select the different ECC code rates, according to which the codewords are implemented, using (a) the log to identify the different ECC code rates according to the addresses of the addressed memory block and (b) operating conditions, such that the different ECC code rates are selected in dependence on both the addresses mapped to the different ECC code rates and the operating conditions; and
    logic to generate write commands to write the codewords in the addressed memory block.

12. The controller of claim 11, including logic to generate read commands to read codewords using read addresses, and to process the codewords having been read from the nonvolatile memory array with different ECC code rates, and including logic to determine, from the log, the ECC code rates for the codewords having been read.

13. The controller of claim 11, including logic to count accesses to portions of the nonvolatile memory array, wherein the operating conditions include access counts.

14. The controller of claim 11, including a temperature sensor coupled to the nonvolatile memory array, wherein the operating conditions include outputs from the temperature sensor.

15. The controller of claim 11, including wear-leveling logic which maintains data about the endurance of portions of the nonvolatile memory array, wherein the operating conditions include endurance data.

16. The controller of claim 11, including program/erase cycle logic which maintains data about program/erase cycle counts of portions of the nonvolatile memory array, wherein the operating conditions include program/erase cycle counts.

17. The controller of claim 11, wherein the nonvolatile memory array includes first and second sub-arrays, including logic to operate the first sub-array as a circular buffer, and to change an ECC code rate base on a first change in operating conditions when a write operation is executed and to apply the changed ECC code rate to writes in the first sub-array until a second change in operating conditions is determined.

18. The controller of claim 17, including logic to operate the first sub-array to store one bit per cell, and to operate the second sub-array to store multiple bits per cell.

19. A method for operating a storage device in which error rates can depend on operating conditions, comprising:
    identifying a portion of a memory array, and determining operating conditions of the identified portion;
    selecting an error correcting code (ECC) algorithm from a plurality of ECC algorithms having different code rates, the ECC algorithm being selected in dependence on the identified portion and the determined operating conditions;
    generating one or more codewords using the selected ECC algorithm for storage in the identified portion;
    mapping portions of the memory array to the selected ECC algorithm in a table that maps different ECC algorithms to addresses of the memory array; and
    writing the one or more codewords to the identified portion of the memory array according to the selected ECC algorithm.

20. The method of claim 19, including:
    reading a particular codeword from an addressed portion of the memory array;
    determining the selected ECC algorithm mapped to the addressed portion; and
    applying the selected ECC algorithm to check for errors in the particular codeword.

21. The method of claim 19, wherein the memory array includes first and second sub-arrays, and wherein the method further includes
    operating the first sub-array as a circular buffer and maintaining a write pointer and an ECC level change pointer;
    changing an ECC code rate base on a change in operating conditions when a write operation is executed and updating the ECC level change pointer to the write pointer; and
    applying a selected ECC code rate based a position of a read address relative to the ECC level change pointer.

* * * * *